United States Patent
Biar et al.

(10) Patent No.: US 7,675,159 B2
(45) Date of Patent: Mar. 9, 2010

(54) BASE SUBSTRATE FOR CHIP SCALE PACKAGING

(76) Inventors: Jeff Biar, 12F., No. 138, Heping Rd., Hsinchu City 300 (TW); Chih-Kung Huang, 12F., No. 138, Heping Rd., Hsinchu City 300 (TW)

( * ) Notice: Subject to any disclaimer, the term of this patent is extended or adjusted under 35 U.S.C. 154(b) by 137 days.

(21) Appl. No.: 11/868,092

(22) Filed: Oct. 5, 2007

(65) Prior Publication Data
US 2008/0224299 A1    Sep. 18, 2008

(30) Foreign Application Priority Data
Mar. 16, 2007   (TW) ............................... 96204286 U

(51) Int. Cl.
*H01L 23/48*   (2006.01)
(52) U.S. Cl. ................ 257/692; 257/698; 257/E29.295
(58) Field of Classification Search .................. 257/698, 257/687, 700, 779
See application file for complete search history.

(56) References Cited

U.S. PATENT DOCUMENTS

| | | | |
|---|---|---|---|
| 5,311,057 A * | 5/1994 | McShane | 257/676 |
| 6,376,903 B1 | 4/2002 | Kim | |
| 6,717,276 B2 | 4/2004 | Walter et al. | |
| 7,501,313 B2 * | 3/2009 | Morrison et al. | 438/118 |
| 2006/0125063 A1 | 6/2006 | Tzu | |

* cited by examiner

Primary Examiner—Jerome Jackson, Jr.
Assistant Examiner—Dale Page
(74) Attorney, Agent, or Firm—Browdy & Neimark, PLLC

(57) ABSTRACT

A base substrate for chip scale package includes a carrier member made of electrical conductive metals with a first through opening; an active member laminated by a base layer made of electrical conductive metal and an intermediate layer made of electrical insulating or dielectric material, the active member having a through opening with a diameter larger that the diameter of the through opening of the base metal member; the active member being coupled with the carrier member in such a way that the intermediate layer is adhered to an upper surface of the carrier member, and these through openings are aligned to define a shoulder around the through opening of the base metal plate.

6 Claims, 3 Drawing Sheets

BASE SUBSTRATE FOR CHIP SCALE PACKAGING

BACKGROUND OF THE INVENTION

1. Field of the Invention

The present invention is generally related to chip assembly and packaging, and more particularly, to a base substrate for chip scale packaging.

2. Description of the Related Art

The conventional chip scale packaging, as shown in FIG. 1, generally has a base board 1 made of glass fibers mixed with epoxy resin. Base board 1 has a center through opening 2 and an upper circuit side 3 with a plurality of bond pads 4. A chip 5 has an active side 7 attached to a bottom side 6 of base board 1. Active side 7 of chip 5 has a plurality of bond pads 8 disposed on the centre portion thereof. Bond pads 8 are interconnected to bond pads 4 via connecting bond wires 9 passing though opening 2.

The packaging mentioned above has a chief defect. It is that for being made of hard materials, base board 1 is always deformed or destroyed during punching or drilling used to form through opening 2.

To eliminate this defect, U.S. Pat. No. 6,717,276 discloses a base substrate constructed by an upper metal layer, a bottom metal layer and an organic tape layer attached therebetween. For needing not to punch or drill, such a base substrate is capable of eliminating the defect of the prior art base board mentioned above. However, it needs a plurality of vias disposed on the organic tape layer, and a plurality of openings disposed on the bottom metal layer to provide a series of electrical interconnects between the upper metal layer and the bottom metal layer. The vias and openings are formed generally by etching methods which are expensive and time-consuming.

Thus, there is desired an improved base substrate for chip scale packaging which can effectively eliminate these and other defects in prior art base substrates mentioned above.

SUMMARY OF THE INVENTION

Accordingly, an object of the present invention is to provide a base substrate which can sufficiently meet the demands for miniaturizing and thinning the chip packaging, and which, at the same time, can be manufactured by a low cost and time-saving way.

An other object of the present invention is to provide an improved base substrate which can effectively improve the electrical performance of a chip attached thereon.

To attain the above objects, a base substrate, according to one aspect of the present invention, comprises a carrier member and an active member. The carrier member is made of electrical conductive metal and has a first through opening with a first diameter. The active member is laminated at least by a base layer made of electrical conductive metal and an intermediate layer made of electrical insulating or dielectric materials, and has a second through opening with a second diameter being larger than the first diameter of the first through opening of the carrier member.

The active member is coupled with the carrier member in such a way that a free side of the intermediate layer thereof is attached to an upper surface of the carrier member and the second through opening thereof is aligned with the first through opening of the carrier member to define a shoulder around the first through opening.

BRIEF DESCRIPTION OF THE DRAWINGS

These and other objects and features of the present invention will become clearer from the following description of the preferred embodiment given with reference to the attached drawings, wherein.

DETAILED DESCRIPTION OF THE PRESENT INVENTION

Figure 1:
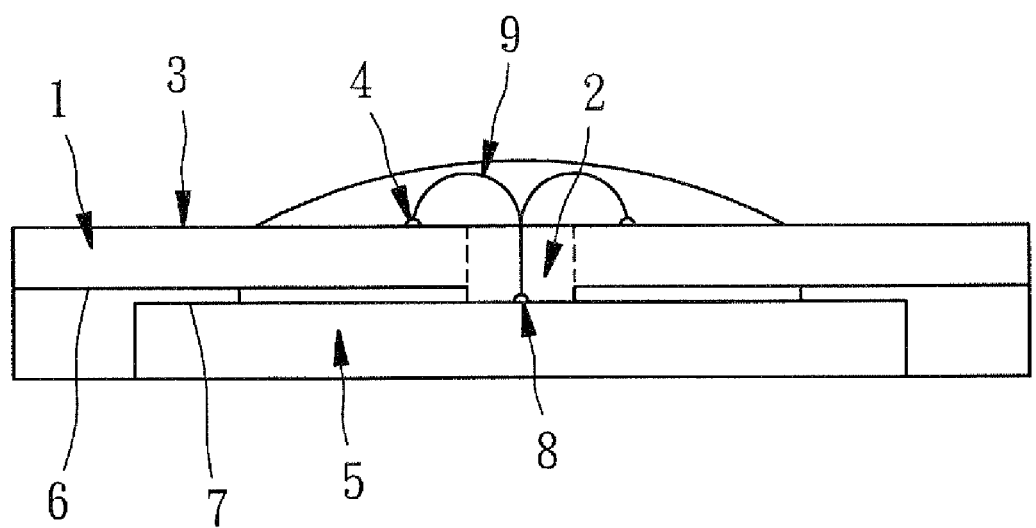
FIG. 1 is a schematic cross-sectional view of a prior art chip scale packaging.
Figure 2:
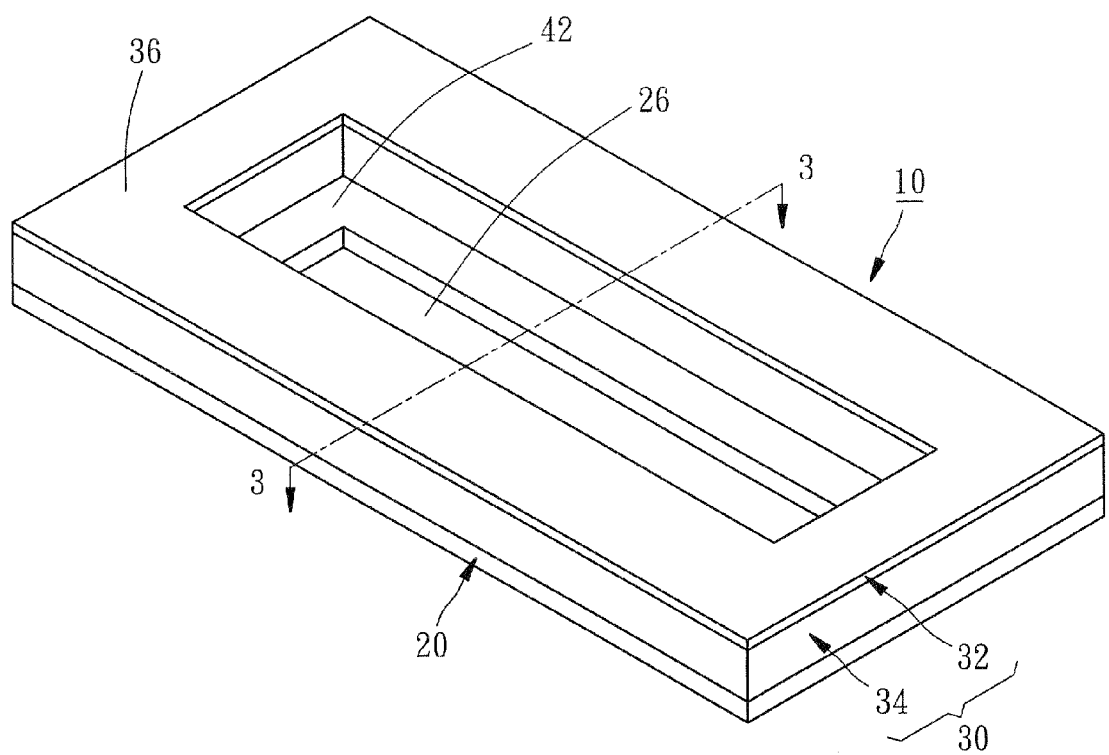
FIG. 2 is a schematic perspective view of a preferred embodiment of a base substrate according to the present invention.
Figure 3:
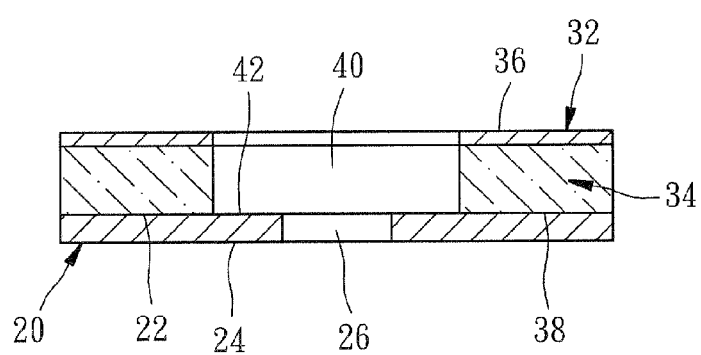
FIG. 3 is a cross-sectional view of the base substrate of FIG. 2 taken along line 3-3.

Referring firstly to FIGS. 2 and 3, the drawings illustrate a preferred embodiment of a base substrate according to one aspect of the present invention. In the drawings, reference numeral 10 denotes a base substrate, and the base substrate 10 comprises a carrier member 20 and an active member 30.

The carrier member 20 is made of an electrical conductive metal sheet, such as copper, iron, alloy of copper or any other suitable metal sheets. In this embodiment, the carrier member 20 is made of copper sheet with a predetermined thickness for providing sufficient supporting strength. The carrier member 20 has an upper surface 22, a bottom surface 24 and at least a first elongate through opening 26.

The active member 30 includes a base layer 32 and an intermediate layer 34 attached to the base layer 32. The base layer 32 is also made of an electrical conductive metal sheet, such as copper, iron, alloy of copper or any other suitable metal sheets, but thinner than the carrier member 20. The intermediate layer 34 is made of electrical insulating or dielectric material, such as polymer films, and can be in a single-ply or multi-ply form. In this embodiment, it is in a single-ply form.

The active member 30 has an upper surface 36, and a bottom surface 38 and at least a second elongate through opening 40. The active member 30 is coupled with the carrier member 20 in such a way that the bottom surface 38 (a free side of the intermediate layer 34) thereof is attached to the upper surface 22 of the carrier member 20 and the second through opening 40 thereof is aligned with the first through opening 26 of the carrier member 20 such that the upper surface 22 of the carrier member 20 forms an annular-shaped shoulder 42 around the first through opening 26.

Figure 4:
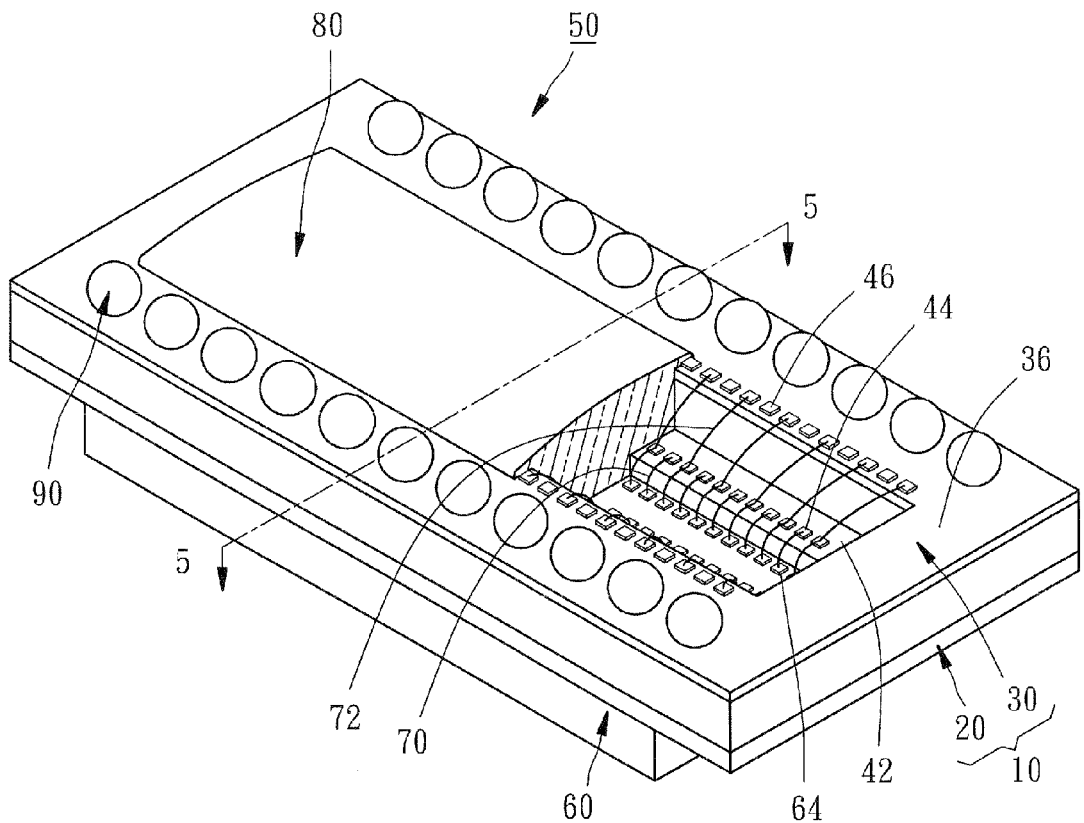
FIG. 4 is a schematic perspective view, partly in section, of a chip scale packaging with the base substrate of FIG. 2.
Figure 5:
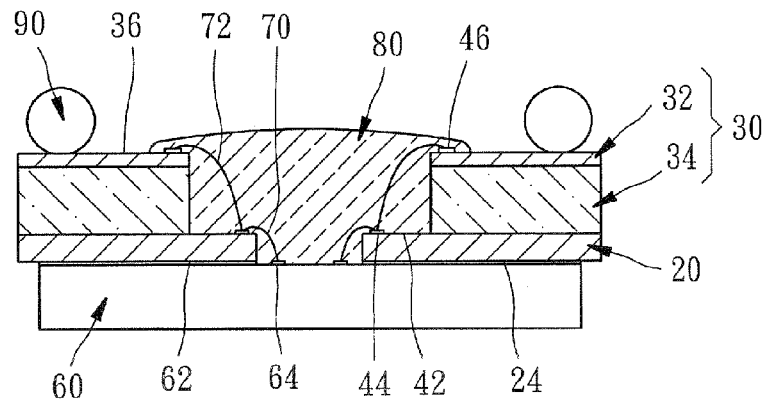
FIG. 5 is a cross-sectional view of the chip scale packaging of FIG. 4 taken along line 5-5.

Referring now to FIGS. 4 and 5, the drawings illustrate a chip scale packaging 50 with the base substrate 10. The shoulder 42 of the substrate 10 is disposed a plurality of first bond pads 44. The upper surface 36 of the active member 30 of the substrate 10 is defined an electrical patterns with a plurality of second bond pads 46 disposed around the second through opening 40.

A chip 60 has an active side 62 disposed a plurality of third bond pads 64 on the center portion thereof. The chip 60 is coupled with the substrate 10 in such a way that the active side 62 thereof is attached to the bottom surface 24 of the carrier member 20 of the substrate 10 and the third bonds 64 of the chip 60 are exposed through the first through opening 26 of the carrier member 20.

The electrical patterns of the active member 30 of the substrate 10 and the chip 60 are electrically interconnected via a first bond wire 70 connecting the third bond pad 64 and the first bond pad 44, and a second bond wire 72 connecting the first bond pad 44 and the second bond pad 46.

A plastic resin 80 is applied over the area covering the first and second through openings 26, 40 (as shown in FIG. 5). For providing an outer electrical connection, the upper surface 36 of the active member 30 of the substrate 10 can be disposed a plurality of solder balls 90 thereon to provide outer electrical connection.

As explained above, for producing without punching, drilling or etching, the base substrate of the present invention not only is capable of eliminating the defects of the prior art but can be manufactured in a low cost and time-saving way. In addition, because the carrier member made of conductive metals is functioned as a grounded layer of the chip packaging, the chip packaging with the base substrate of the present invention certainly has a better electrical performance than the prior art.

What is claimed is:

1. A base substrate for chip scale package, comprising:
    a carrier member made of electrical conductive metals and at least having a first through opening with a first diameter;
    an active member laminated by a base layer made of electrical conductive metals; and
    an intermediate layer made of electrical insulating or dielectric material,
    wherein said active member has a second through opening with a second diameter being larger than the first diameter of said first through opening of said base metal member;
    wherein said active member couples with said carrier member in such a way that said intermediate layer thereof is adhered to an upper surface of said carrier member,
    wherein said second through opening is aligned with said first through opening of said carrier member to define a shoulder around said first through opening, and
    wherein said carrier member is thicker than said base layer of said active member.

2. The base substrate according to claim 1, wherein said shoulder is annular-shaped around said first through opening.

3. The base substrate according to claim 1, wherein said shoulder is disposed a plurality of first bond pads thereon.

4. The base substrate according to claim 3, wherein an upper surface of said base layer of said active member is disposed a plurality of second bond pads thereon.

5. The base substrate according to claim 4, wherein said second bond pads are disposed around said second through opening.

6. The base substrate according to claim 1, wherein said intermediate layer of said active member is in a multi-ply form.

* * * * *